United States Patent [19]
Reich et al.

[11] Patent Number: 5,920,487
[45] Date of Patent: *Jul. 6, 1999

[54] TWO DIMENSIONAL LITHOGRAPHIC PROXIMITY CORRECTION USING DRC SHAPE FUNCTIONS

[75] Inventors: Alfred J. Reich; Warren D. Grobman; Bernard J. Roman; Kevin D. Lucas, all of Austin; Clyde H. Browning, Briarcliff; Michael E. Kling, Austin, all of Tex.

[73] Assignee: Motorola Inc., Austin, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/810,561

[22] Filed: Mar. 3, 1997

[51] Int. Cl.$^6$ .............................. G03F 17/50; G03F 7/26; G03F 1/00

[52] U.S. Cl. .................... 364/491; 364/468.28; 327/517; 378/34; 378/35; 395/500.22

[58] Field of Search ...................................... 364/488–491, 364/578, 468.28; 327/514; 378/34–35

[56] References Cited

U.S. PATENT DOCUMENTS

| | | | |
|---|---|---|---|
| 4,595,295 | 6/1986 | Wilczynski | 356/401 |
| 4,636,626 | 1/1987 | Hazama et al. | 250/201 |
| 4,753,901 | 6/1988 | Ellsworth et al. | 437/67 |
| 4,895,780 | 1/1990 | Nissan-Cohen et al. | 430/5 |
| 5,046,012 | 9/1991 | Morishita et al. | 364/468 |
| 5,208,124 | 5/1993 | Sporon-Fielder et al. | 430/5 |
| 5,242,770 | 9/1993 | Chen et al. | 430/5 |
| 5,477,467 | 12/1995 | Rugg | 364/490 |
| 5,663,893 | 9/1997 | Wampler et al. | 364/491 |
| 5,731,986 | 3/1998 | Yang | 364/491 |
| 5,763,955 | 6/1998 | Findley et al. | 257/775 |

OTHER PUBLICATIONS

Fu et al. ("Enhancement of lithographic patterns by using serif features", IEEE Transactions on Electron Devices, vol. 38, No. 12, Dec. 1991, pp. 2599–2603).

Yang et al. ("Advanced I–line lithography for 0.5 mu m CMOS technology", Proceedings of Technical Papers, 1991 International Symposium on VLSI Technology, Systems, and Applicants, May 22, 1991, pp. 22–27).

Roth ("Growing and shrinking operations on a monotone polygon", Proceedings of the Twenty–third Annual Allerton Conference on Communication, Control, and Computing, Jan. 1, 1985, pp. 508–509).

Kane et al. ("Systolic algorithms for rectilinear polygons", Computer Aided Design, vol. 19, No. 1, pp. 15–24, Jan. 1, 1987).

BACUS News, "Evaluation of a fast and flexible OPC Package: OPTISSIMO", Society of Photo–Optical Instrumentation Engineers, vol. 13, Issue 1, pp. 3 & 5–8, Jan. (1997).

*Primary Examiner*—Kevin J. Teska
*Assistant Examiner*—Phallaka Kik
*Attorney, Agent, or Firm*—Bruce E. Hayden

[57] ABSTRACT

Integrated circuit designs are continually shrinking in size. Lithographic processes are used to transfer these designs to a semiconductor substrate. These processes typically require that the exposure wavelength of light be shorter than the smallest dimension of the elements within the circuit design. When this is not the case, exposure energy such as light behaves more like a wave than a particle. Additionally, mask manufacturing, photoresist chemical diffusion, and etch effects cause pattern transfer distortions. The result is that circuit elements do not print as designed. To counter this effect the circuit designs themselves can be altered so that the final printed results better matches the initial desired design. The process of altering designs in this way is called Lithographic Proximity Correction (LPC). Square (142), cross (162), octagon (172), and hammerhead (202) serifs are added to integrated circuit designs by shape manipulation functions to perform two dimensional (2-D) LPC.

20 Claims, 7 Drawing Sheets

TWO DIMENSIONAL LITHOGRAPHIC PROXIMITY CORRECTION USING DRC SHAPE FUNCTIONS

CROSS REFERENCE TO RELATED APPLICATION

This application is related to our copending patent application entitled "ONE DIMENSIONAL LITHOGRAPHIC PROXIMITY CORRECTION USING DRC SHAPE FUNCTIONS", filed of even date herewith and assigned to the assignee hereof.

FIELD OF THE INVENTION

The present invention generally relates to Very Large Scale Integrated (VLSI) lithography mask design, and more specifically to two dimensional lithographic proximity correction (LPC) of VLSI design databases using Design Rule Checking (DRC) shape functions.

BACKGROUND OF THE INVENTION

The invention herein discloses algorithms for applying Lithographic Proximity Corrections (LPC) to very large scale integrated (VLSI) circuit design databases to compensate for 2-dimensional (2-D) lithographic errors.

LPC attempts to overcome a shortcoming in lithography that prevents the accurate printing of shapes in a design database when the minimum dimensions of the shapes are approximately the same as or below the wavelength of exposure. 2-D lithographic proximity effects occur in mask manufacture, because of electromagnetic diffraction from orthogonal edges of a mask feature, and 2-D chemical effects in the photoresist. The results are generally undesirable. For example, corners become rounded and narrow line ends are shortened. The effects can be overcome by modifying the shapes from their original design in ways that correct the undesirable lithographic transformations that will take place during printing. Thus, even though a corrected mask doesn't resemble an intended design, when the corrected mask is finally printed on a wafer, the wafer pattern better matches the intended design.

FIG. 1 is photolithographic simulation of how a rectangle 82 prints using a deep ultra-violet (UV) stepper, when the rectangle feature size is similar to the UV wavelength used. Such a rectangle 82 prints as an oval 80. This illustrates the line end shortening discussed above.

FIG. 2 is a photolithographic simulation of the same rectangle 82 that has square serifs 90, 92, 94, 96 placed on the four corners of the rectangle 82. The result of adding these square serifs 90, 92, 94, 96 to an initial rectangular shape 82 is that the printed shape 98 more closely matches the shape of the original rectangle 82.

BRIEF DESCRIPTION OF THE DRAWINGS

A better understanding of the present invention can be obtained when the following Detailed Description is considered in conjunction with the following drawings, in which.

DETAILED DESCRIPTION

This invention consist of algorithms that are described using operations similar to the high-level scripting languages used by existing Design Rule Checking (DRC) software. DRC software applications have been around for many years, and are not only stable and robust, but also very similar.

Most DRC software has the capability of generating shapes according to user specified rules. This capability is used to support the verification of A layout design rules. In DRC applications such shapes are used as an intermediate step and are not intended to be printed or merged with the design database.

This approach to LPC uses the same shape generating capability, but leaves the shapes in the database. The rules for generating the LPC shapes (i.e., the algorithms of this invention) are written so that the resulting shapes will account for the lithographic transformations that will take place during printing.

Figure 1:
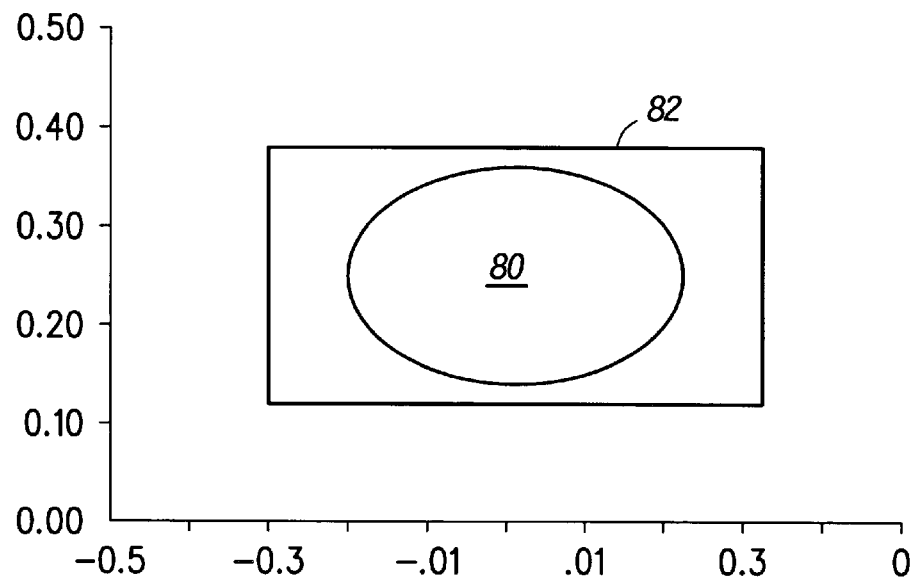
FIG. 1 is photolithographic simulation of how a rectangle prints using a deep ultra-violet (UV) stepper.
Figure 2:
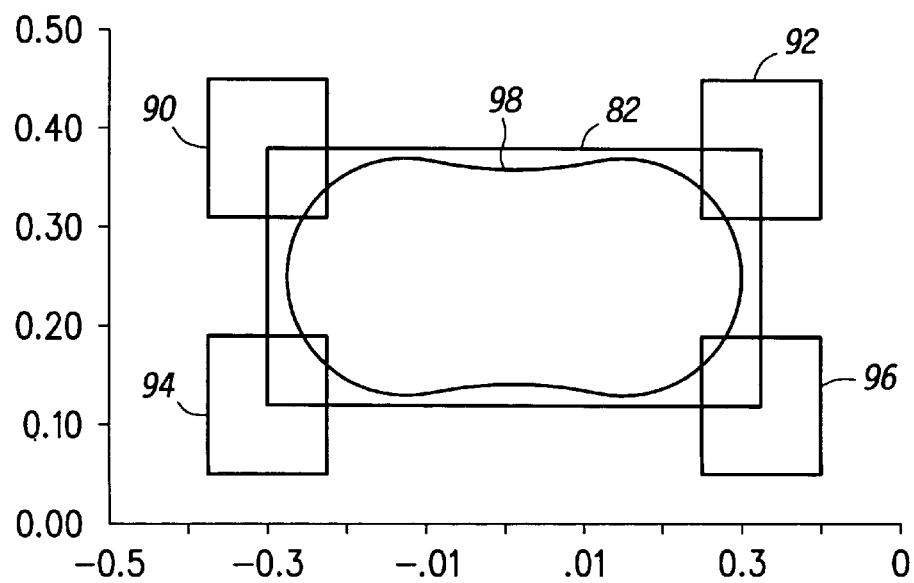
FIG. 2 is a photolithographic simulation of the same rectangle shown in FIG. 1 that has squares serifs placed on the four corners of the rectangle.
Figure 3:
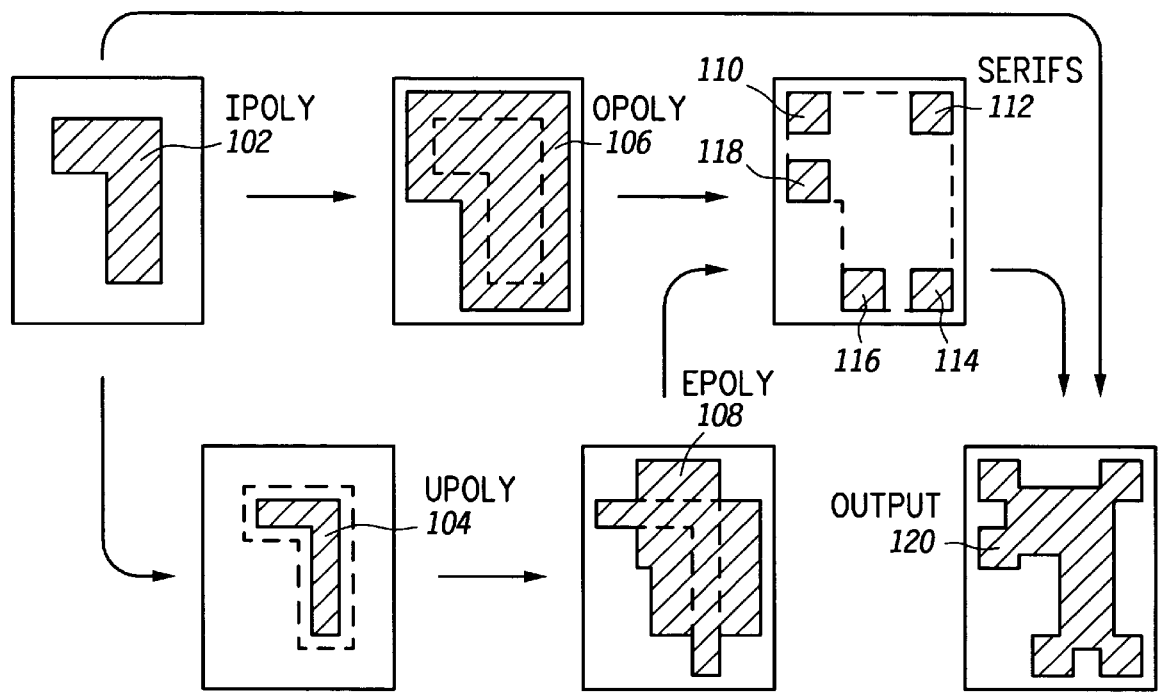
FIGS. 3 and 4 combined illustrate a method of adding square serifs to a design shape, in accordance with the present invention.
Figure 4:
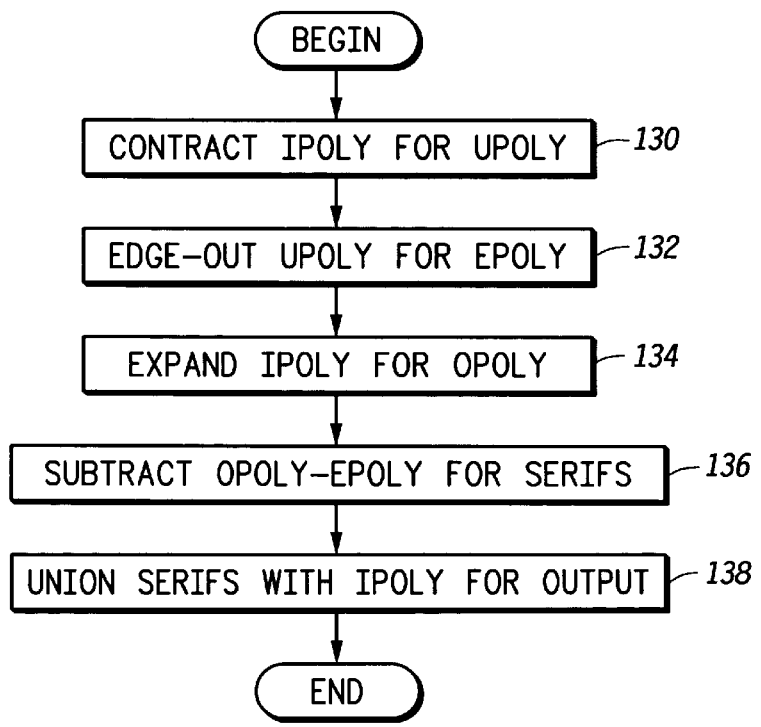

FIGS. 3 and 4 combined illustrate a method of adding square serifs to an initial design shape. FIG. 3 is a layout view of shape manipulation utilized in the method. FIG. 4 is a flow chart that is illustrating the method of adding square serifs to the design shape.

The method starts with an initial polygon (IPOLY) shape 102. This initial polygon shape 102 is "undersized" or shrunk by given amount to form an "undersized" polygon (UPOLY) 104, step 130. The undersized polygon (UPOLY) 104 is "edged-out" to form an edged-out polygon (EPOLY) 108, step 132. The edge-out operation moves each edge of a polygon outward without changing the lengths of the edges. Contrast this with a standard growth or shrink operation utilized in step 130 where edge lengths change. It should be noted that not all DRC tools support an "edge-out" function, and in these cases, the "edge-out" function can be duplicated as a combination of other, more atomic, DRC shape functions.

The initial polygon (IPOLY) 102 is grown by a specified amount to form an "oversized" polygon shape (OPOLY) 106, step 134. The edged-out polygon shape (EPOLY) 108 is then subtracted from the oversized polygon shape (OPOLY) 106 to form square serifs (SERIFS) 110, 112, 114, 116, 118, step 136. Finally the square serifs (SERIFS) 110, 112, 114, 116, 118 are "unioned" with the original polygon shape (IPOLY) 102 to form the output polygon shape (OUTPUT) 120, step 138.

Figure 5:
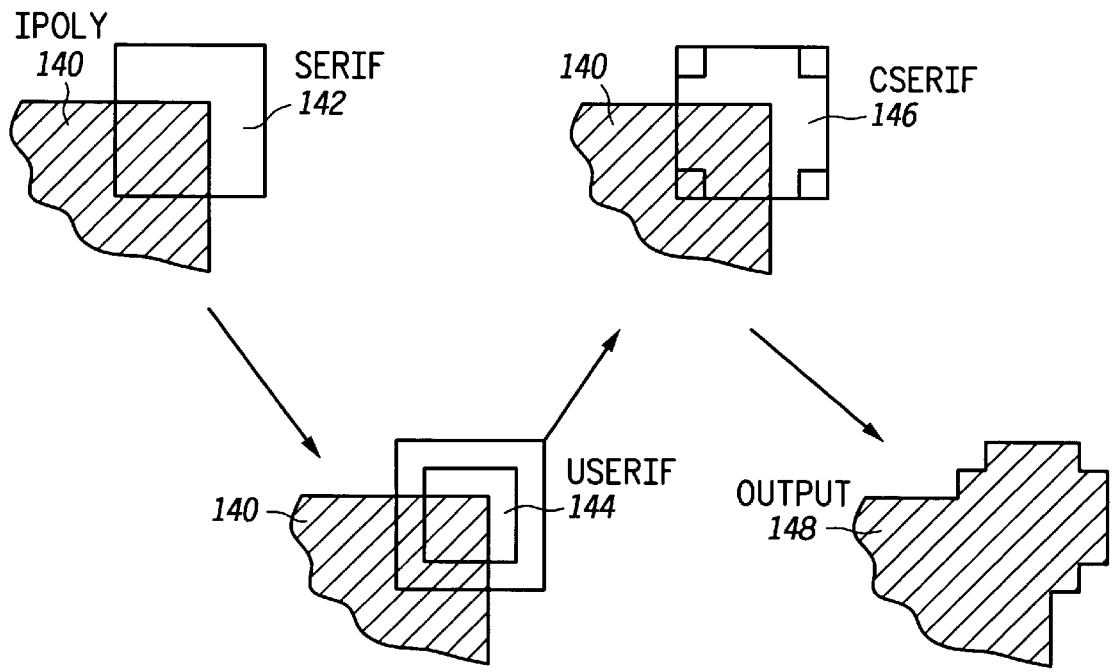
FIGS. 5 and 6 combined illustrate a method of forming "cross shaped" serifs from the rectangular serifs shown in FIG. 3 and formed by the method in FIG. 4, in accordance with the present invention.
Figure 6:
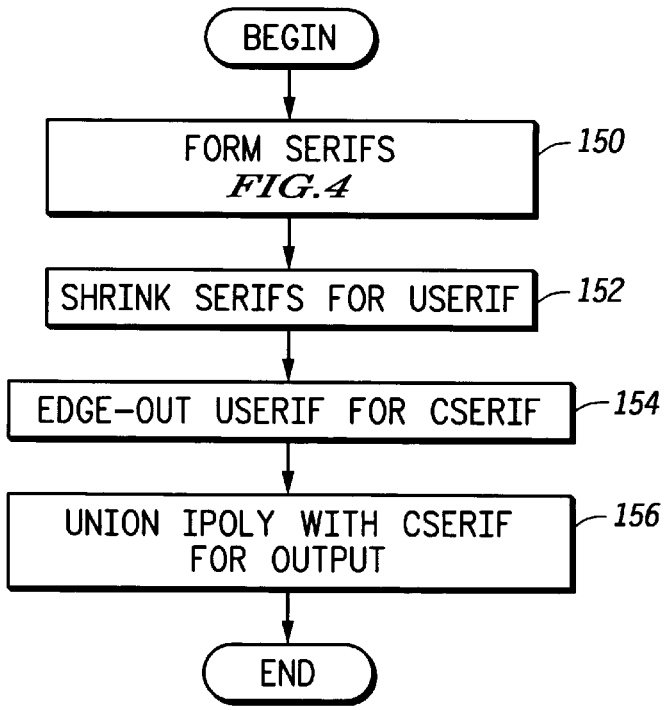

FIGS. 5 and 6 combined illustrate a method of forming "cross-shaped" serifs from the rectangular serifs 110, 112, 114, 116, 118 shown in FIG. 3 and formed by the method in FIG. 4. FIG. 5 is layout view of the polygon shapes utilized in the method. FIG. 6 is a flow chart illustrating the method for forming cross shaped serifs.

A serif 142 is formed on initial shape (IPOLY) 140, as shown in FIG. 4. The serif 142 is then shrunk or contracted to form an "undersized" serif (USERIF) 144, step 152. The undersized serif (USERIF) 144 is then edged-out to form a cross-shaped serif (CSERIF) 146, step 154. Finally the cross-shape serif (CSERIF) 146 is "unioned" with the initial polygon (IPOLY) 140 to form the output polygon (OUTPUT) 148, step 156.

Figure 7:
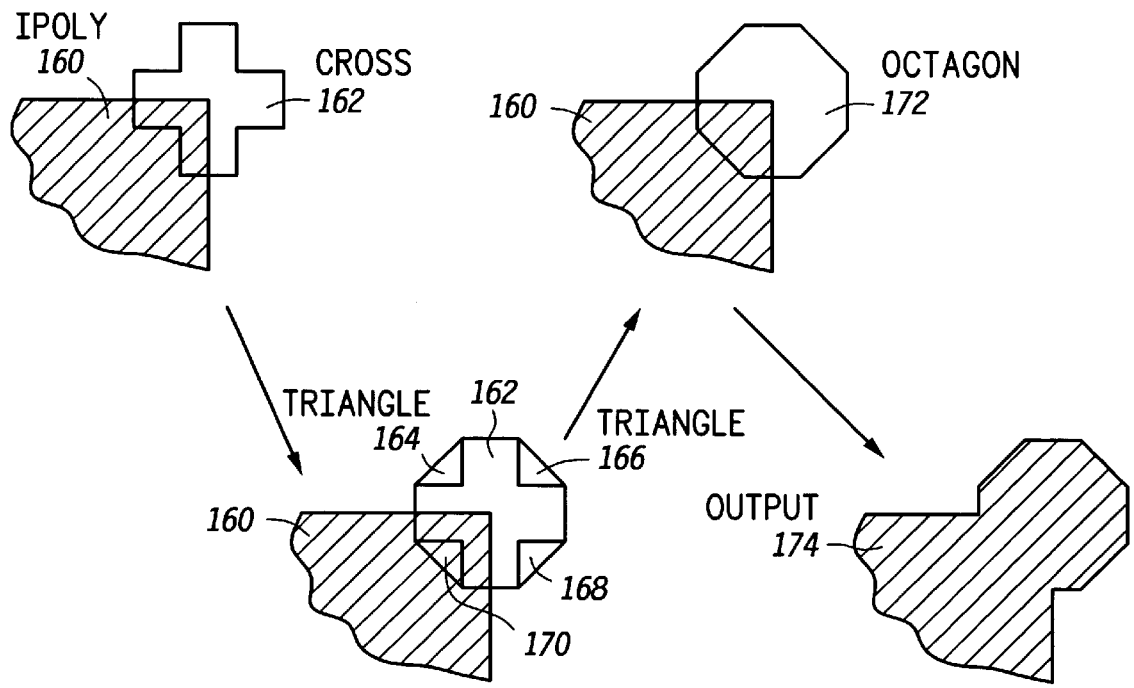
FIGS. 7 and 8 combined illustrate a method of forming octagon shaped serifs, in accordance with the present invention.
Figure 8:
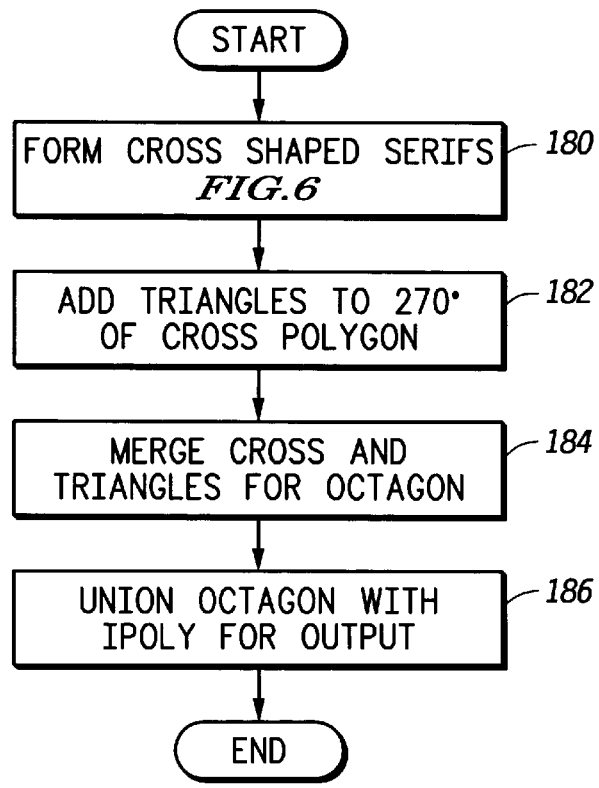

FIGS. 7 and 8 combined illustrate a method of forming octagonshaped serifs. FIG. 7 is a layout view of the shapes utilized to create the octagon-shaped serifs. FIG. 8 is a flow chart illustrating the method of creating octagon-shaped serifs.

Starting with the initial polygon shape (IPOLY) 160, a cross-shaped serif 162 is formed as shown in FIG. 6, step 180. Then in each instance where there is a 270 degree angle in the cross-shaped serif 162, the 270 degree angle is filled in with a triangle 164, 166, 168, 170, step 182. The cross-shaped serif 162 is then unioned with the four triangles formed 164, 166, 168, 170 in step 182 to form an octagon-shaped serif 172, step 184. Finally the octagon-shaped serif 172 is unioned with the initial polygon shape (IPOLY) 160 to form an output polygon shape (OUTPUT) 174, step 186.

Figure 9:
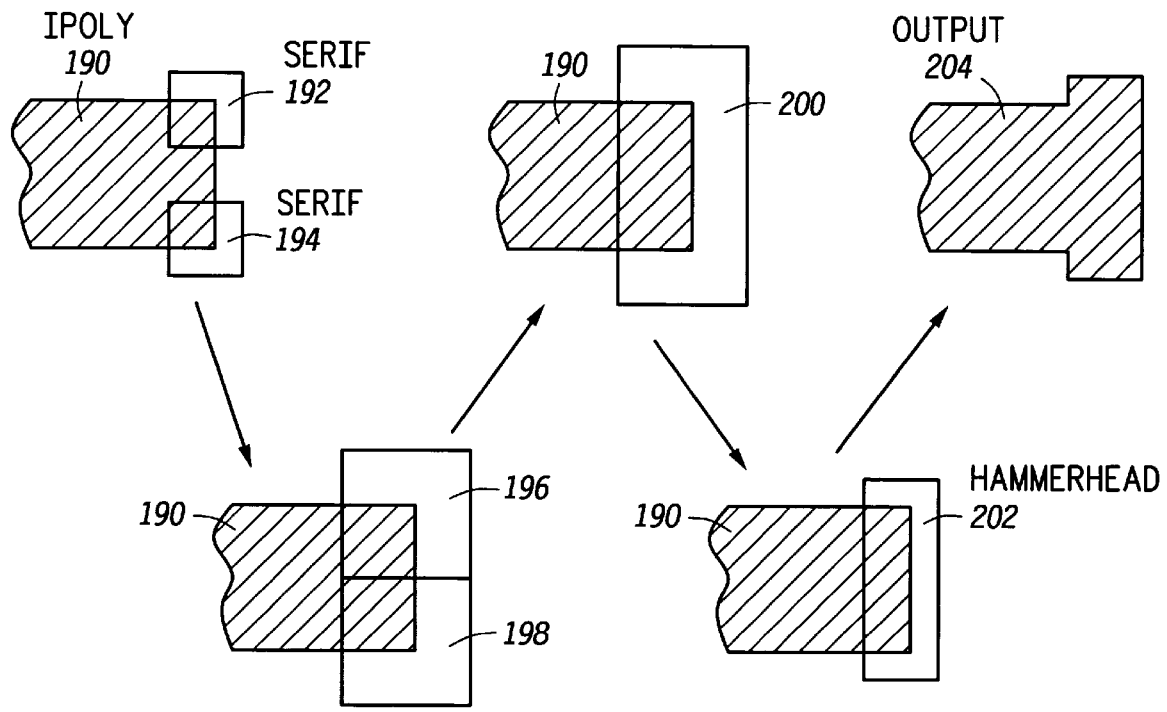
FIGS. 9 and 10 combined illustrate a method of forming "hammerhead" serifs at the ends of lines of polygons, in accordance with the present invention.
Figure 10:
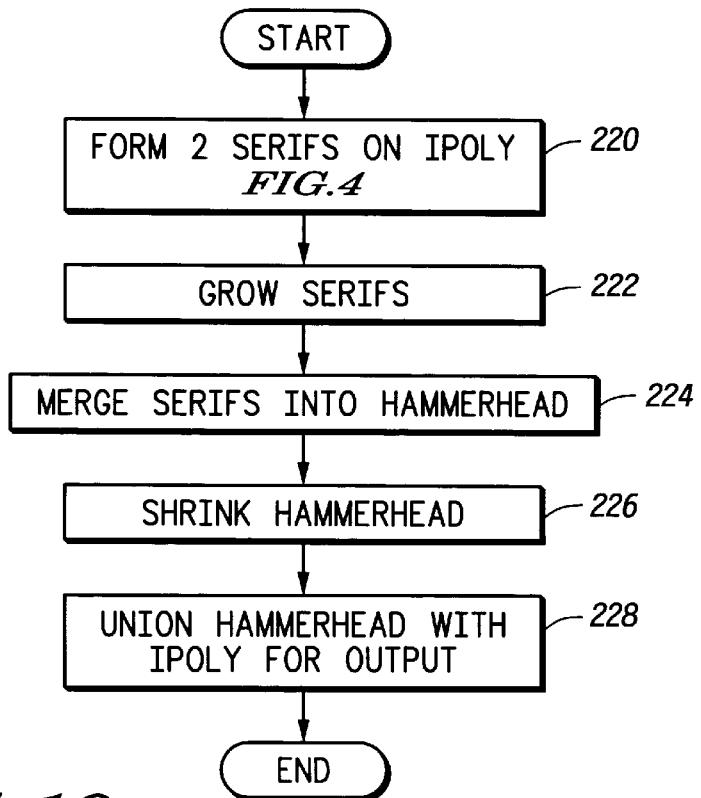

FIGS. 9 and 10 combined illustrate a method of forming "hammerhead" serifs at the ends of lines of polygons. FIG. 9 is a layout view of the shapes utilized to form the hammerhead serifs. FIG. 10 is a flowchart illustrating a method for forming hammerhead serifs.

Starting with initial polygon shape (IPOLY) 190, polygon serifs 192, 194 are created as shown in FIG. 4, step 220. The serifs, 192, 194 are then grown until their edges meet, 196, 198, step 222. The "oversized" serifs, 196, 198 are then merged into a hammerhead serif 200 by use of the union function, step 224. The hammerhead serif 200 is then shrunk or contracted into a smaller hammerhead serif 202, step 226. Finally the smaller hammerhead serif 202 is unioned with the initial polygon shape (IPOLY) 190 to create the output polygon shape (OUTPUT) 204, step 228.

Figure 11:
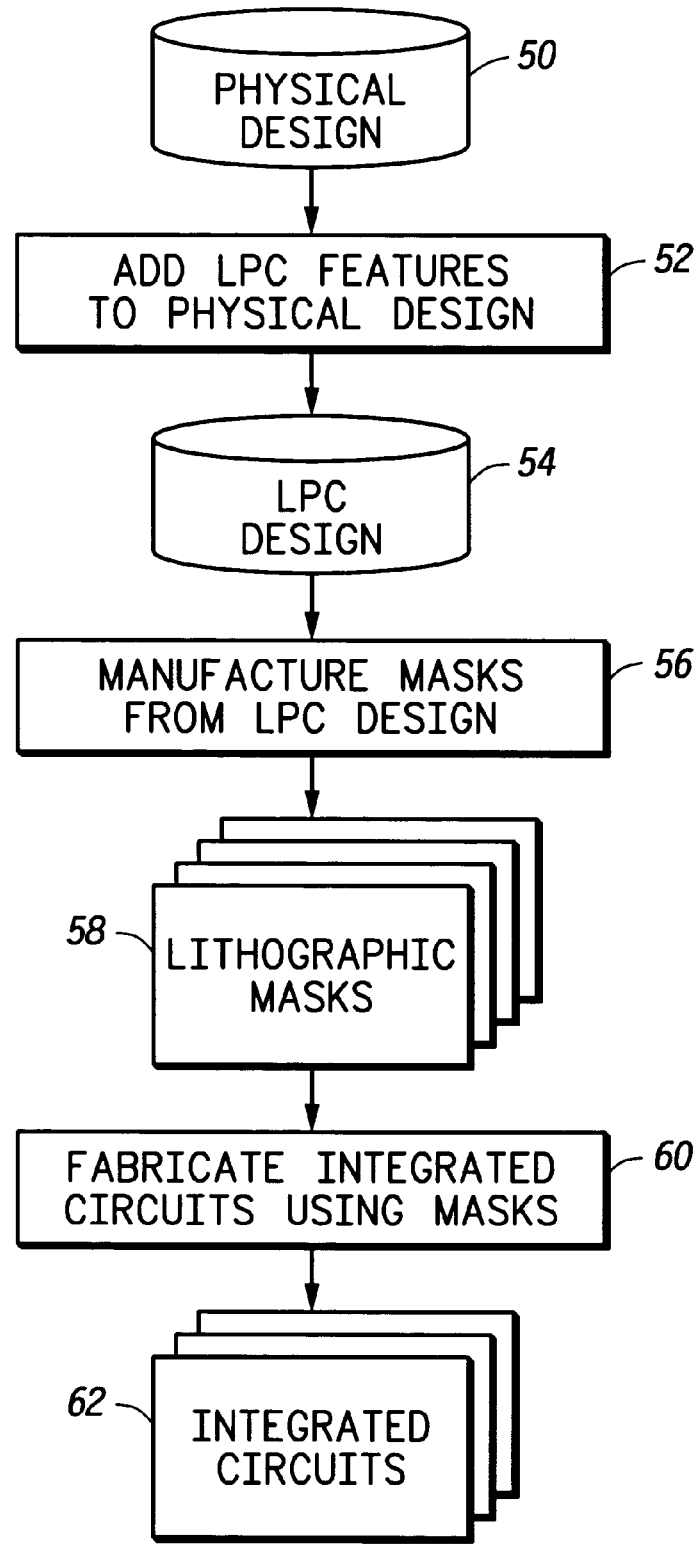
FIG. 11 is a block diagram that illustrates integrated circuit fabrication utilizing the LPC techniques disclosed herein.

FIG. 11 is a block diagram that illustrates integrated circuit fabrication utilizing the LPC techniques disclosed herein. Integrated circuit design today primarily utilizes Computer Aided Design (CAD) tools to design integrated circuits. These IC design CAD tools generate semiconductor physical design files 50. Semiconductor physical design files 50 include integrated circuit dimensions, element dimensions, and element locations within an integrated circuit. The physical design files 50 locate elements and connections within a two-dimensional substrate area of an integrated circuit die. Preferably, the physical design files 50 include physical structures for performing the functions of an integrated circuit design from which the physical design file was derived. LPC features are added 52 to the original shapes in the physical design file 50 using the techniques disclosed herein, resulting in the creation of LPC design files 54. The LPC design files 54 are then converted 56 into a set of lithographic masks 58 corresponding to the layers in the physical design file 50 and LPC design files 54. The lithographic masks 58 are used to fabricate 60 integrated circuits 62 using well know techniques.

Integrated circuit design resulting in the creation of physical design files 50 is taught in "*Principles of CMOS VLSI Design: A Systems Perspective*", by N. H. E. Weste and K. Eshragian in the VLSI Series by Addison-Wesley, 1985. Fabrication techniques are outlined in "*Silicon Processing for the VLSI Era, Volume 1: Process Technology*", by Wolf and Tauber, copyright 1986, published by Lattice Press. Process integration is taught by the second book in the series: "*Silicon Processing for the VLSI Era, Volume 2: Process Integration*", by Wolf, copyright 1990, published by Lattice Press.

Figure 12:
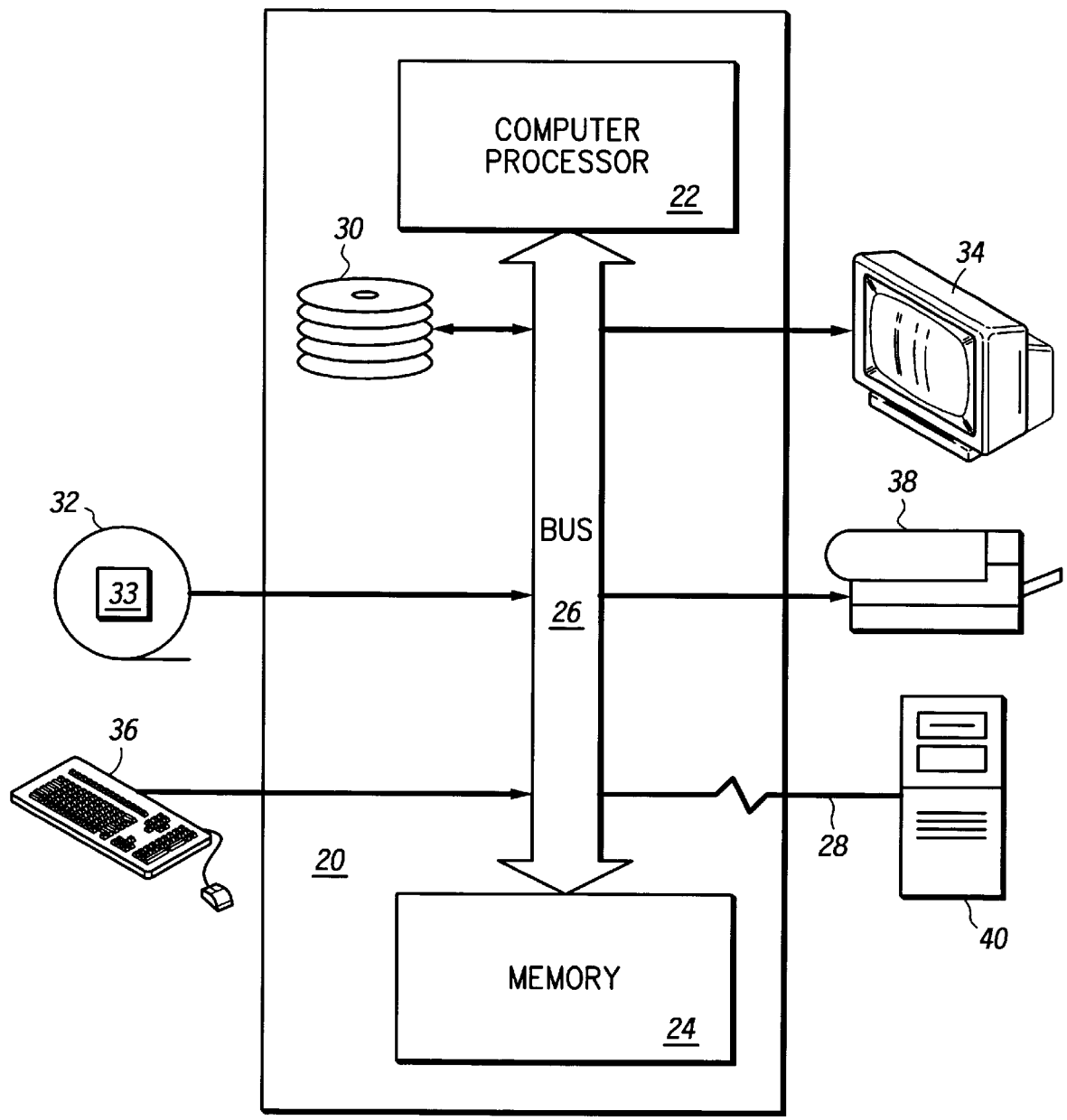
FIG. 12 is a block diagram showing a General Purpose Computer.

As illustrated in FIG. 12, the various methods discussed above may be implemented within dedicated hardware, or within processes implemented within a General Purpose Computer 20. The General Purpose Computer 20 has a Computer Processor 22, and Memory 24, connected by a Bus 26. Memory 24 includes relatively high speed machine readable media such as DRAM, SRAM, ROM, FLASH, EEPROM, and bubble memory. Also connected to the Bus are Secondary Storage 30, External Storage 32, output devices such as a monitor 34, input devices such as a keyboard (with mouse) 36, and printers 38. Secondary Storage 30 includes computer readable media such as hard disk drives, magnetic drum, and bubble memory. External Storage 32 includes computer readable media such as floppy disks, removable hard drives, magnetic tape, CD-ROM, and even other computers, possibly connected via a communications line. The distinction drawn here between Secondary Storage 30 and External Storage 32 is primarily for convenience in describing the invention. As such, it should be appreciated that there is substantial functional overlap between these elements. Executable versions of computer software 33, such as the LPC software utilized to implement the techniques disclosed herein and user programs are typically read from the External Storage 32 and loaded for execution directly into the Memory 24, or stored on the Secondary Storage 30 prior to loading into Memory 24 and execution. The physical design files 50 and LPC design files 54 utilized to make lithographic reticles are stored on either Secondary Storage 30 or External Storage 32.

Those skilled in the art will recognize that modifications and variations can be made without departing from the spirit of the invention. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

We claim:

1. A method of adding lithographic proximity correction shapes to a semiconductor physical design containing an initial polygon, comprising:

A) shrinking the initial polygon by a first specified amount to produce an undersized polygon;

B) edging-out the undersized polygon by a second specified amount to produce an edged-out polygon;

C) expanding the initial polygon by a third specified amount to produce an oversized polygon; and D) subtracting the edged-out polygon from the oversized polygon to produce a set of serifs.

2. The method in claim 1 which further comprises:

E) unioning the set of serifs with the initial polygon to form an output polygon.

3. A method of fabricating integrated circuits utilizing the method in claim 2 which further comprises:

F) generating a LPC design file containing the output polygon;

G) creating a set of one or more lithographic masks from the LPC design file; and H) fabricating a plurality of integrated circuits from the set of one or more lithographic masks.

4. The method in claim 1 wherein step (B) comprises:

1) moving a left edge of the initial polygon left by the second specified amount to form a left polygon;

2) moving a right edge of the initial polygon right by the second specified amount to form a right polygon;

3) moving a top edge of the initial polygon up by the second specified amount to form a top polygon;

4) moving a bottom edge of the initial polygon down by the second specified amount to form a bottom polygon; and 5) unioning the initial polygon with the left polygon, the right polygon, the top polygon, and the bottom polygon to form the edged-out polygon.

5. The method in claim 1 wherein the step (B) comprises:

1) shrinking one of the set of serifs by a fourth specified amount to form a shrunken serif; and 2) creating the edged-out polygon from the undersized polygon by moving each edge of the undersized polygon out individually by a fifth specified amount, wherein:

each of a plurality of new edges of the edged-out polygon has a corresponding old edge and has a same length as the corresponding old edge and is parallel to the corresponding old edge.

6. The method in claim 1 which further comprises:

E) edging-out one from the set of serifs by a fourth specified amount to form a cross-shaped polygon.

7. The method in claim 6 which comprises:

F) unioning the cross-shaped polygon with the initial polygon to form an output polygon.

8. A method of fabricating integrated circuits utilizing the method in claim 7 which further comprises:

G) generating a LPC design file containing the output polygon;

H) creating a set of one or more lithographic masks from the LPC design file; and I) fabricating a plurality of integrated circuits from the set of one or more lithographic masks.

9. The method in claim 6 which further comprises:

F) constructing a triangle wherein each of two sides of the triangle are two adjacent interior sides on the cross-shaped polygon and the third side of the triangle is a line connecting two endpoints of the two adjacent interior sides;

G) unioning the triangle with the cross-shaped polygon; and

H) repeating steps (F) and (G) to form an octagon-shaped polygon by constructing a different triangle as the triangle for each set of two adjacent interior sides of the cross-shaped polygon and by unioning the different triangle with the cross-shaped polygon.

10. The method in claim 9 which further comprises:

I) unioning the octagon-shaped polygon with the initial polygon to form an output polygon.

11. A method of fabricating integrated circuits utilizing the method in claim 10 which further comprises:

J) generating a LPC design file containing the output polygon;

K) creating a set of one or more lithographic masks from the LPC design file; and L) fabricating a plurality of integrated circuits from the set of one or more lithographic masks.

12. The method in claim 1 which further comprises:

E) growing two from the set of serifs by an amount sufficient to merge the two from the set of serifs to form a single merged shape; and F) shrinking the single merged shape by the amount sufficient to merge the two from the set of serifs to form a hammerhead shape.

13. The method in claim 12 which further comprises:

G) unioning the hammerhead shape with the initial polygon to form an output polygon.

14. A method of fabricating integrated circuits utilizing the method in claim 13 which further comprises:

H) generating a LPC design file containing the output polygon;

I) creating a set of one or more lithographic masks from the LPC design file; and J) fabricating a plurality of integrated circuits from the set of one or more lithographic masks.

15. The method in claim 12 wherein:

the amount sufficient to merge the two from the set of serifs is
computed by a formula (F-S)/2-T, wherein:
F is a width size of the initial polygon;
S is a size of one of the two from the set of serifs; and
T is an amount that one of the two from the set of serifs is offset from an edge of the initial polygon.

16. The method in claim 1 which comprises:

E) receiving a size and an offset;

F) calculating a halfsize equal to a half of the size;

G) calculating the first specified amount to be equal to the halfsize minus the offset;

H) calculating the third specified amount to be equal to the halfsize plus the offset; and I) specifying the second specified amount to be equal to the size.

17. Computer software for adding lithographic proximity correction shapes to a semiconductor physical design containing an initial polygon, comprising:

A) a set of computer instructions for shrinking the initial polygon by a first specified amount to produce a undersized polygon;

B) a set of computer instructions for edging-out the undersized polygon by a second specified amount to produce an edged-out polygon;

C) a set of computer instructions for expanding the initial polygon by a third specified amount to produce an oversized polygon; and D) a set of computer instructions for subtracting the edged-out polygon from the oversized polygon to produce a set of serifs.

18. A computer readable medium containing the computer software in claim 1 encoded in a machine readable format.

19. A method of manufacturing the computer readable medium in claim 18 which comprises:

encoding the computer software in machine readable format on the computer readable medium.

20. A data processing system for adding lithographic proximity correction shapes to a semiconductor physical design containing an initial polygon, comprising:

A) means for shrinking the initial polygon by a first specified amount to produce a undersized polygon;

B) means for edging-out the undersized polygon by a second specified amount to produce an edged-out polygon;

C) means for expanding the initial polygon by a third specified amount to produce an oversized polygon; and D) means for subtracting the edged-out polygon from the oversized polygon to produce a set of serifs.

* * * * *